United States Patent
Kong et al.

(10) Patent No.: US 12,191,240 B2
(45) Date of Patent: Jan. 7, 2025

(54) HYBRID GLASS CORE FOR WAFER LEVEL AND PANEL LEVEL PACKAGING APPLICATIONS

(71) Applicant: Intel Corporation, Santa Clara, CA (US)

(72) Inventors: Jieying Kong, Chandler, AZ (US); Srinivas Pietambaram, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1182 days.

(21) Appl. No.: 16/539,254

(22) Filed: Aug. 13, 2019

(65) Prior Publication Data

US 2021/0050289 A1 Feb. 18, 2021

(51) Int. Cl.
*H01L 23/498* (2006.01)
*H01L 23/00* (2006.01)
*H01L 23/64* (2006.01)

(52) U.S. Cl.
CPC .. *H01L 23/49833* (2013.01); *H01L 23/49822* (2013.01); *H01L 23/49838* (2013.01); *H01L 23/49894* (2013.01); *H01L 23/645* (2013.01); *H01L 24/16* (2013.01); *H01L 2224/16225* (2013.01); *H01L 2924/19042* (2013.01); *H01L 2924/19103* (2013.01)

(58) Field of Classification Search
None
See application file for complete search history.

(56) References Cited

U.S. PATENT DOCUMENTS

| | | | |
|---|---|---|---|
| 9,412,935 B1 * | 8/2016 | Lin | H10N 50/01 |
| 9,420,707 B2 | 8/2016 | Ma et al. | |
| 2011/0147059 A1 * | 6/2011 | Ma | H01L 24/73 |
| | | | 156/60 |
| 2014/0041923 A1 * | 2/2014 | Hisada | H05K 1/115 |
| | | | 174/266 |

* cited by examiner

*Primary Examiner* — Bo B Jang
(74) *Attorney, Agent, or Firm* — Schwabe, Williamson & Wyatt, P.C.

(57) ABSTRACT

Embodiments disclosed herein include hybrid cores for electronic packaging applications. In an embodiment, a package substrate comprises a plurality of glass layers and a plurality of dielectric layers. In an embodiment, the glass layers alternate with the dielectric layers. In an embodiment, a through-hole through the plurality of glass layers and the plurality of dielectric layers is provided. In an embodiment a conductive through-hole via is disposed in the through-hole.

24 Claims, 10 Drawing Sheets

HYBRID GLASS CORE FOR WAFER LEVEL AND PANEL LEVEL PACKAGING APPLICATIONS

TECHNICAL FIELD

Embodiments of the present disclosure relate to semiconductor devices, and more particularly to electronic packages with hybrid glass cores.

BACKGROUND

Copper-clad laminates (CCLs) are often used in a wide range of electronic devices, such as PCs and mobile terminals, as the core of semiconductor packaging substrates and printed circuit boards (PCBs) to provide mechanical support and electrical signal connections. CCLs are made of stacked prepreg materials and copper foils. Typical prepreg comprises glass fiber cloth that is embedded in a resin. Low coefficient of thermal expansion (CTE) and high modulus are key mechanical requirements for CCL cores.

With the advancement of semiconductor packaging technology, such as increasing I/O densities and the integration of heterogeneous chips, the package core needs to be redesigned to allow for more process margin. For example, total thickness variation (TTV) and shrinkage need to be improved for future generations of packaging architectures. CCL cores do not satisfy the TTV and shrinkage requirements of future architectures and leads to assembly difficulties. High incoming core TTV carries over all the way to build-up and solder resist layers, resulting in the need of planarization processes, which are cost prohibitive.

Glass cores have been proposed. Glass is an attractive alternative to CCLs because the glass can provide low TTV, low CTE, low shrinkage, and high modulus. However, through-hole vias in thick glass cores (e.g., greater than approximately 400 µm) are exceedingly hard to pattern. For example, laser drilling of thick glass cores results in through glass vias with severely tapered profiles, which limits the achievable aspect ratios of the vias.

EMBODIMENTS OF THE PRESENT DISCLOSURE

Figure 1A:
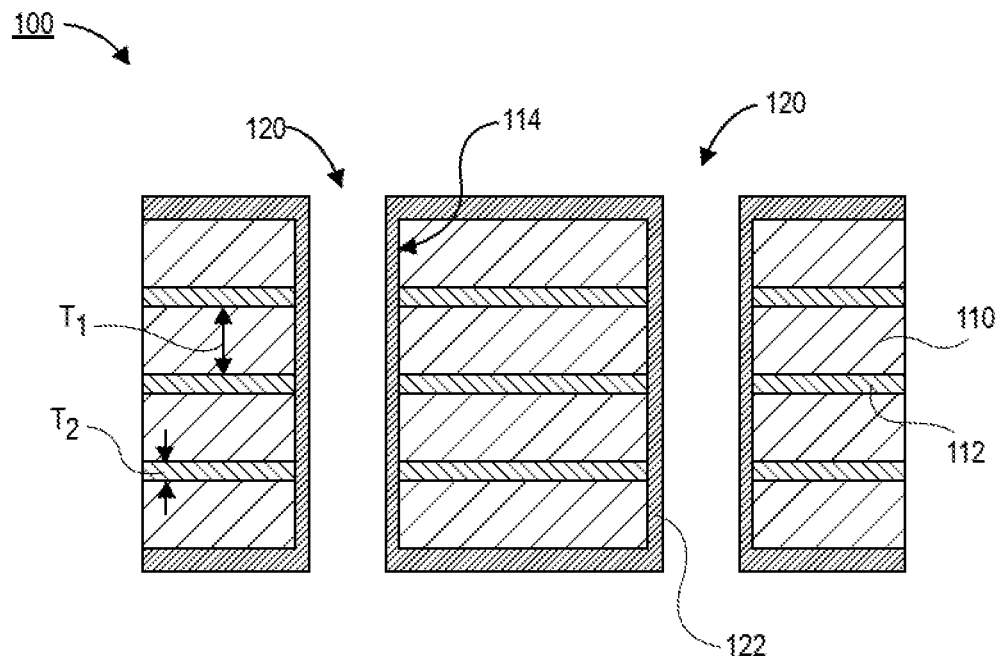
FIG. 1A is a cross-sectional illustration of a hybrid core with glass layers and dielectric layers, in accordance with an embodiment.

Described herein are electronic packages with hybrid glass cores, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, advances in semiconductor packaging architectures are resulting in increased demands on the material properties of the package substrate. For example, the core needs to have improved total thickness variation (TTV), lower coefficient of thermal expansion (CTE), lower shrinkage, and higher elastic modulus. While glass provides these material properties, it is cost prohibitive to pattern through-holes in suitably thick glass cores. Accordingly, embodiments disclosed herein include hybrid cores.

In an embodiment, the hybrid core comprises a plurality of glass layers that are adhered together by dielectric material. Each of the glass layers may have a thickness that is suitable for forming openings in a cost effective manner. For example, the thickness of the glass layer may be approximately 100 μm or less. Accordingly, when the diameter of the through-hole is approximately 100 μm, the aspect ratio of glass thickness to opening diameter is approximately 1:1. Such low aspect ratios are easily obtainable with patterning processes. Each of the glass layers may then be laminated over each other to provide a total thickness that is suitable for providing the mechanical properties needed for the core. For example, four or more glass layers may be laminated over each other to provide a total thickness that is approximately 400 μm or greater.

In an embodiment, the majority of the hybrid core is comprised of glass layers. That is, the dielectric layers that are used to adhere the glass layers together may comprise a relatively small fraction of the hybrid core. For example, the glass layers may each be approximately 100 μm thick, and the dielectric layers may each be approximately 100 nm thick. Accordingly, the material properties of the hybrid core are dominated by the glass. Therefore, the desirable properties of a glass core (e.g., low TTV, low CTE, low shrinkage, high elastic modulus, etc.) are obtainable with cost effective manufacturing processes to form the through-hole vias.

Referring now to FIG. 1A, a cross-sectional illustration of a hybrid core 100 is shown, in accordance with an embodiment. In an embodiment, the hybrid core 100 may comprise a plurality of glass layers 110 and a plurality of dielectric layers 112. The glass layers 110 may alternate with the dielectric layers 112. In an embodiment, the dielectric layers 112 are an adhesive layer. For example, the dielectric layers 112 are suitable for adhering the glass layers 110 together. In the illustrated embodiment, four glass layers 110 are shown. However, it is to be appreciated that any number of glass layers 110 may be included in the hybrid core 100. In an embodiment, the dielectric layers 112 are located only between the glass layers 110. That is, the topmost glass layer 110 and the bottommost glass layer 110 only have a dielectric layer 112 over a single surface. However, it is to be appreciated that in some embodiments, a dielectric layer 112 may also be over the topmost glass layer 110 and the bottommost glass layer 110.

As shown in FIG. 1A, the glass layers 110 may have a first thickness $T_1$ and the dielectric layers 112 have a second thickness $T_2$. In an embodiment, the first thickness $T_1$ is greater than the second thickness $T_2$. In a particular embodiment the first thickness $T_1$ may be approximately 100 times greater than the second thickness $T_2$, or the first thickness $T_1$ may be approximately 1,000 times greater than the second thickness $T_2$. For example, the first thickness $T_1$ may be approximately 100 μm and the second thickness $T_2$ may be approximately 100 nm. As such, the material properties of the glass layers 110 dominate overall properties of the hybrid core 100. That is, the material properties of a hybrid core in accordance with embodiments disclosed herein may have material properties that are substantially similar to a monolithic glass layer having a similar overall thickness.

In an embodiment, the total thickness of the hybrid core 100 may be approximately 400 μm or greater. In other embodiments, the hybrid core 100 may have a total thickness that is approximately 700 μm or greater. Particularly, the overall thickness of the hybrid core 100 is not limited by processing limitations of the through-hole via formation. Whereas a solid glass core can only be formed to a certain thickness before through-hole via formation becomes prohibitively expensive, embodiments disclosed herein can have any desired thickness. This is because the through-hole 120 is formed by a plurality of openings (with each opening being formed through a single glass layer 110). Accordingly, any number of glass layers 110 may be stacked over each other to provide the desired total thickness of the hybrid core 100.

In an embodiment, the through-holes 120 may pass through the thickness of the hybrid core 100. The through-holes may have any desired diameter. For example, the diameter of the through-holes 120 may be approximately 150 μm or smaller, 100 μm or smaller, or 50 μm or smaller. In a particular embodiment, the diameter of the through-holes 120 may be approximately equal to the first thickness $T_1$. That is, an aspect ratio of the openings through each glass layer 110 (i.e., thickness:diameter) may be approximately 1:1. However, it is to be appreciated that other aspect ratios (e.g., greater than 1:1 or smaller than 1:1) may also be provided in accordance with various embodiments.

In an embodiment, the through-holes 120 may be lined with a conductive layer 122. In some embodiments, the portion of the conductive layer 122 that passes through the through-holes 120 may be referred to as a through-hole via or a plated through-hole (PTH) via. A PTH via may be a structure with a conductive layer 122 plated along sidewall surfaces of an opening where the conductive layer 122 does not completely fill the opening. For example, as shown in FIG. 1A, the through-hole 120 is not fully filled. In some embodiments, the remainder of the through-hole 120 that is not filled by conductive layer 122 may be filled with a plug material (not shown). The plug material may be a dielectric material, a magnetic material, other non-conductive materials, or combinations of two or more such materials.

In an embodiment, the conductive layer 122 may be copper or the like. In some embodiments, the conductive layer 122 may comprise a seed layer with a conductive material plated over the seed layer. In an embodiment, the conductive layer 122 may be in direct contact with portions of the glass layers 110. For example, the conductive layer 122 may be in direct contact with a sidewall surface 114 of the glass layers 110 within the through-holes 120. In some embodiments, the conductive layer 122 may also be positioned over a surface of the topmost glass layer 110 and over a surface of the bottommost glass layer 110. In the illustrated embodiment, the conductive layer 122 is shown as being over the entire topmost and bottommost surfaces of the hybrid core 100. However, it is to be appreciated that the conductive layer 122 may be patterned so that portions of the topmost surface and the bottommost surface of the hybrid core 100 are not covered by the conductive layer 122. Furthermore, it is to be appreciated that in some embodiments, a dielectric layer 112 may separate the conductive layer 122 from the topmost glass layer 110 and the bottommost glass layer 110.

Figure 1B:
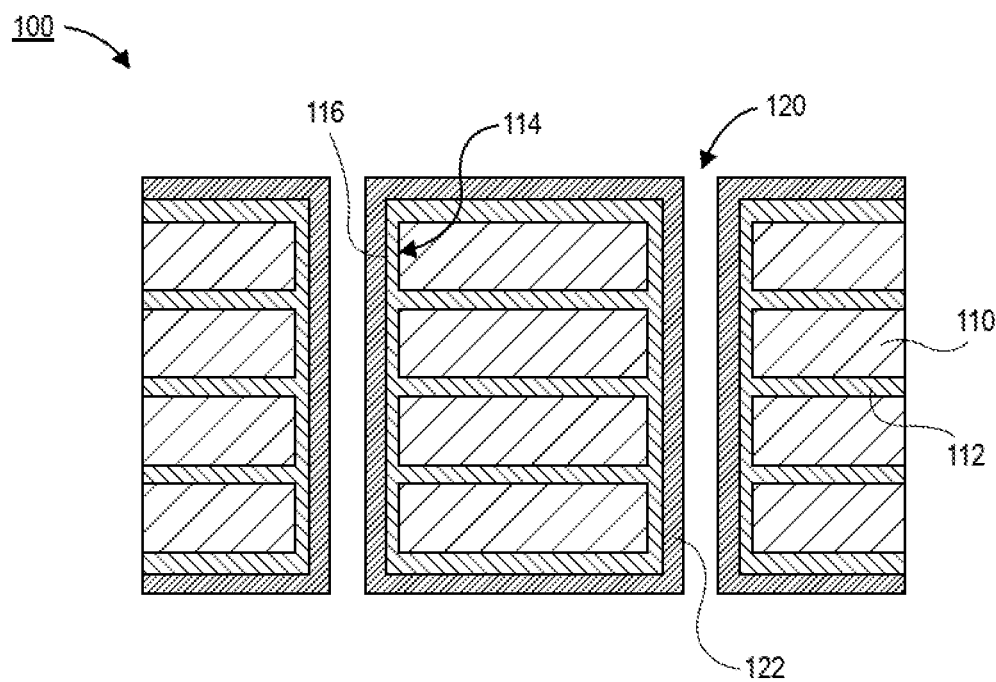
FIG. 1B is a cross-sectional illustration of a hybrid core with glass layers that are entirely embedded by dielectric layers, in accordance with an embodiment.

Referring now to FIG. 1B, a cross-sectional illustration of a hybrid core 100 is shown, in accordance with an additional embodiment. The hybrid core 100 in FIG. 1B may comprise a plurality of glass layers 110 and a plurality of dielectric layers 112. In an embodiment, the dielectric layers 112 may completely embed each of the glass layers 110. For example, the sidewall surfaces 114 of the glass layers 110 may be covered by portions 116 of the dielectric layers 112. Furthermore, the topmost glass layer 110 and the bottommost glass layer 110 may also be fully embedded by the dielectric layers 112. This is different from the hybrid core 100 in FIG. 1A where the dielectric layers 112 are only between glass layers 110.

In an embodiment, the conductive layer 122 may not contact portions of the glass layers 110. That is, portions of the dielectric layers 112 separate the conductive layer 122 from the glass layers 110. For example, the sidewalls 114 of the glass layers 110 are separated from the conductive layer 122 in the through-hole 120 by portions 116 of the dielectric layer 112. In some embodiments, completely embedding the glass layers 110 in the dielectric layers 112 allows for the conductive layer 122 to be deposited with an electroless deposition process. Accordingly, the aspect ratio of the through-holes 120 is not a problem during deposition of the conductive layer 122.

Figure 2A:
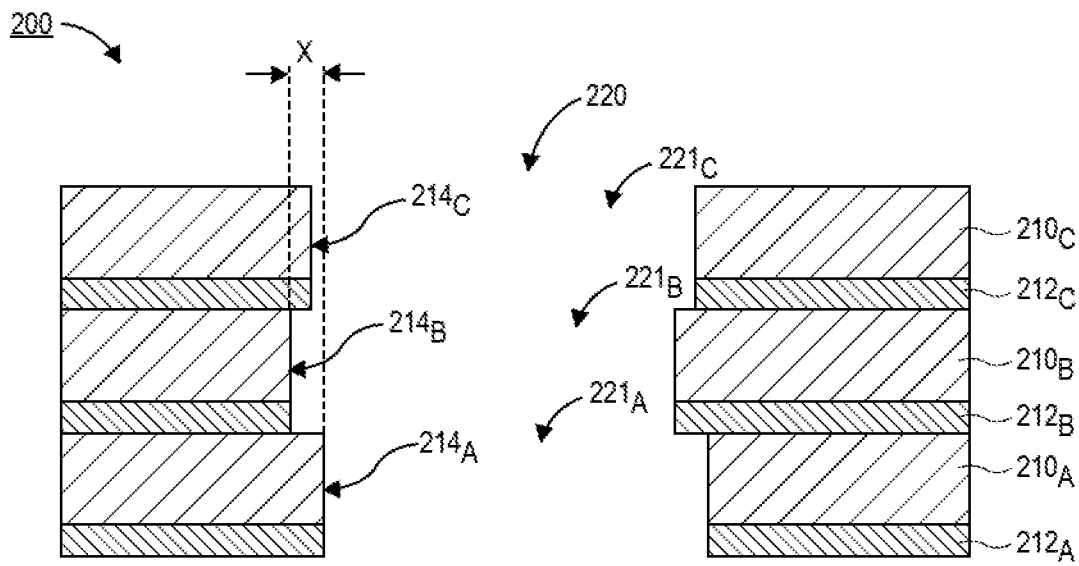
FIG. 2A is a zoomed in illustration of a through-hole through a hybrid core, in accordance with an embodiment.

Referring now to FIG. 2A, a zoomed in cross-sectional illustration of a hybrid core 200 that more clearly illustrates the through-hole 220 is shown, in accordance with an embodiment. As shown, a plurality of glass layers $210_{A-C}$ and dielectric layers $212_{A-C}$ are shown. Each glass layer 210 may have an opening $221_{A-C}$. In an embodiment, the glass layers $210_{A-C}$ are laminated over each other. Accordingly, in some embodiments there may be some amount of misalignment. For example, a misalignment X is present between the sidewall $214_A$ and the sidewall $214_B$. In an embodiment, the misalignment X may be less than approximately 5% of the diameter of the openings 221. For example, the misalignment X may be approximately 5 μm or less, or approximately 1 μm or less.

Figure 2B:
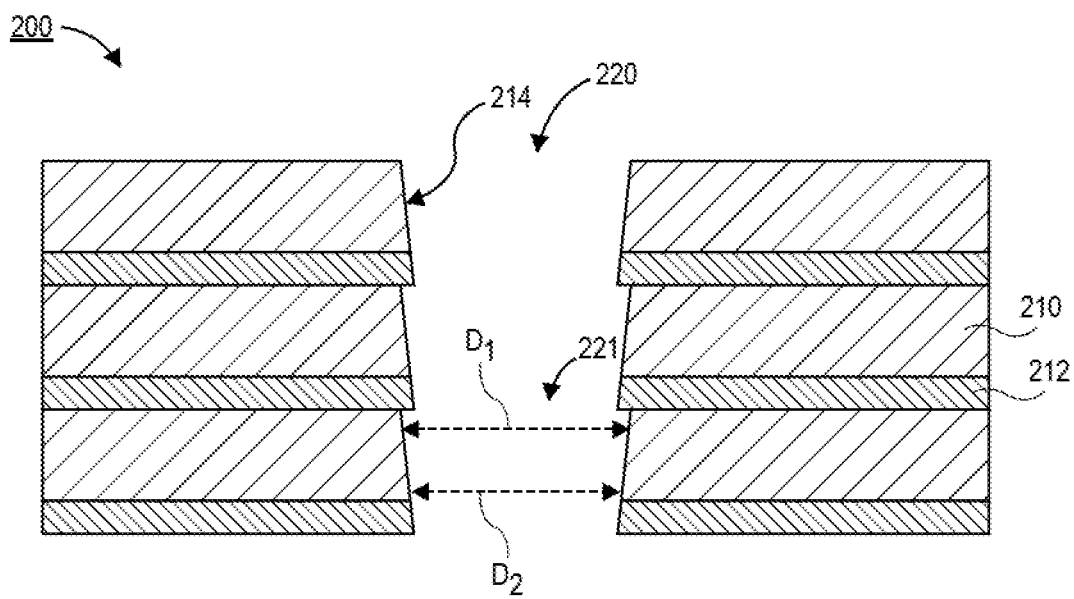
FIG. 2B is a zoomed in illustration of a through-hole through a hybrid core that illustrates the profile of the through-hole, in accordance with an embodiment.

Referring now to FIG. 2B, a zoomed in cross-sectional illustration of a hybrid core 200 is shown, in accordance with an additional embodiment. As shown, the glass layers 210 may include openings 221 that include some degree of taper. That is, the sidewalls 214 of each opening 221 may have a non-vertical profile. Particularly, a first diameter $D_1$ at the top of the opening 221 may be larger than a second diameter $D_2$ at the bottom of the opening 221. In an embodiment, the difference between the first diameter $D_1$ and the second diameter $D_2$ may be approximately 5% or less of the first diameter $D_1$. For example, the difference between the first diameter $D_1$ and the second diameter $D_2$ may be approximately 5 μm or less, or approximately 1 μm or less. In an embodiment, the tapered profile of sidewalls 214 may be provided by a laser ablation process used to form the openings 221 in each glass layer 210.

As shown in FIG. 2B, the stacked glass layers 210 with tapered openings 221 form a through-hole 220 that has a saw toothed profile. For example, glass layers 210 may overhang the underlying glass layer 210. Accordingly, the through-hole 220 may not have substantially vertical sidewall profiles. In FIG. 2B, the openings 221 are all shown as being perfectly aligned. That is, the centerlines of each of the openings 221 in each glass layer 210 are substantially aligned with each other. However, it is to be appreciated that the openings 221 may have some amount of misalignment, similar to the misalignment X illustrated above with respect to FIG. 2A.

Referring now to FIGS. 3A-3E, a series of cross-sectional illustrations depicting a process for forming a hybrid core is shown, in accordance with an embodiment. In an embodiment, the hybrid core assembled in FIGS. 3A-3E is similar to the hybrid core 100 described above with respect to FIG. 1A.

Figure 3A:
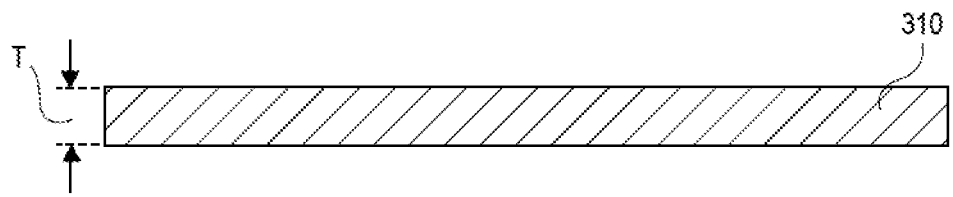
FIG. 3A is a cross-sectional illustration of a glass layer, in accordance with an embodiment.

Referring now to FIG. 3A, a cross-sectional illustration of a glass layer 310 is shown, in accordance with an embodiment. In an embodiment, the glass layer 310 has a thickness T. In an embodiment, the thickness T may be approximately 200 μm or less, or approximately 100 μm or less.

Figure 3B:
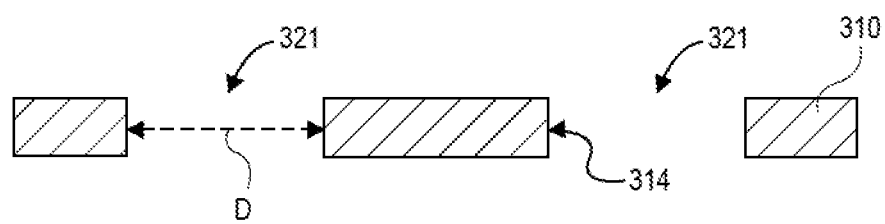
FIG. 3B is a cross-sectional illustration of openings through the glass layer, in accordance with an embodiment.

Referring now to FIG. 3B, a cross-sectional illustration of the glass layer 310 after one or more openings 321 are formed through the thickness of the glass layer 310 is shown, in accordance with an embodiment. In an embodiment, the openings 321 may be formed with any suitable process. For example, the openings 321 may be formed with an etching process, a laser ablation process, or the like. While the sidewalls 314 of the openings 321 are shown as being substantially vertical, it is to be appreciated that embodiments may include sidewalls 314 that have some amount of tapering. For example, the sidewalls 314 may have a taper that is similar to the taper shown in FIG. 2B.

In an embodiment, the openings 321 may have a diameter D. The diameter D may be approximately 50 μm or greater, or 100 μm or greater. In a particular embodiment, the diameter D may be chosen in order to provide an opening 321 with a relatively low aspect ratio. For example, the aspect ratio (thickness T to diameter D) may be approximately 1:1 or smaller (e.g., the diameter D may be larger than the thickness T). Low aspect ratio openings 321 are relatively easy and inexpensive to produce compared to high aspect ratio openings. Accordingly, the overall cost associated with forming a hybrid core is reduced compared to a monolithic glass core.

Figure 3C:
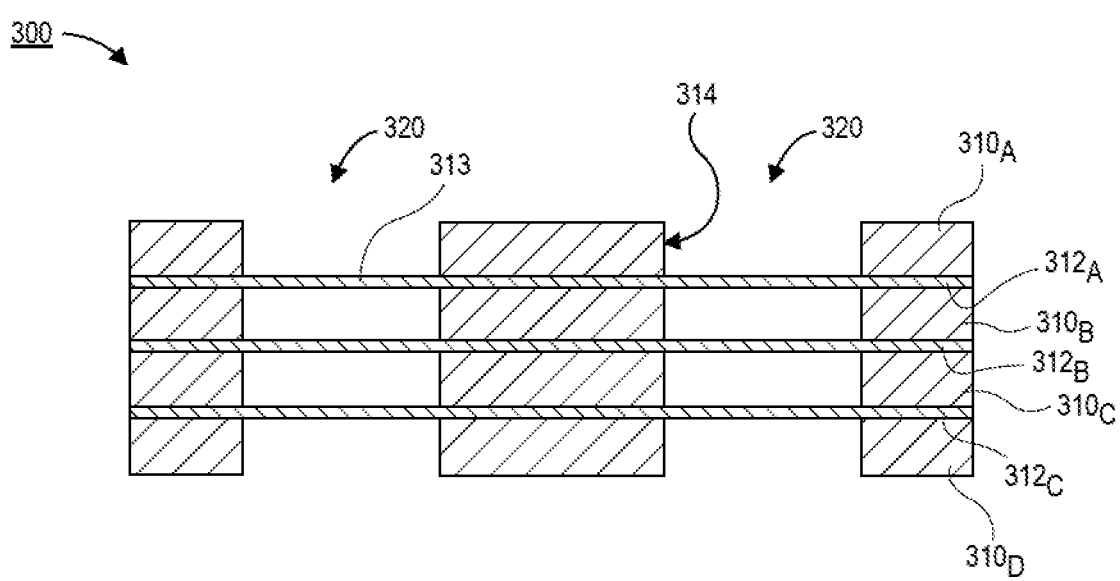
FIG. 3C is a cross-sectional illustration of a hybrid core that comprises a plurality of glass layers stacked over each other with dielectric layers between the glass layers, in accordance with an embodiment.

Referring now to FIG. 3C, a cross-sectional illustration of a hybrid core 300 after a stack of glass layers $310_{A-D}$ are stacked over each other is shown, in accordance with an embodiment. In an embodiment, the glass layers $310_{A-D}$ may be stacked over each other with a lamination process, a hot press process, or the like. In some embodiments, an alignment mark (not shown) on the surface of the glass layers 310 may be used to properly align the openings 321 over each other in order to form the through-holes 320. While shown with perfect alignment in FIG. 3C, it is to be appreciated that some degree of misalignment between the sidewalls 314 of the glass layers may be present (similar to what is described with respect to FIG. 2A above).

In an embodiment, a dielectric layer 312 may be disposed between each of the glass layers 310. The dielectric layers $312_{A-C}$ may be an organic adhesive material. As such, the dielectric layers $312_{A-C}$ adhere the glass layers $310_{A-D}$ to each other. The dielectric layers $312_{A-C}$ may have a thickness that is substantially smaller than the thickness T of the glass layers 310. For example, the thickness of each dielectric layer 312 may be approximately 100 times smaller, or approximately 1,000 times smaller than the thickness T of the glass layers 310. In an particular embodiment, the thickness of the dielectric layers 312 may be approximately 100 nm or less.

In an embodiment, the dielectric layers $312_{A-C}$ are not patterned when the glass layers $310_{A-D}$ are stacked over each other. For example, a portion 313 of the dielectric layers 312 may span across the through-hole 320. In an embodiment, the dielectric layers $312_{A-C}$ are cured after the glass layers $310_{A-D}$ are combined. The curing may comprise a heat treatment suitable for the chosen dielectric material.

Figure 3D:
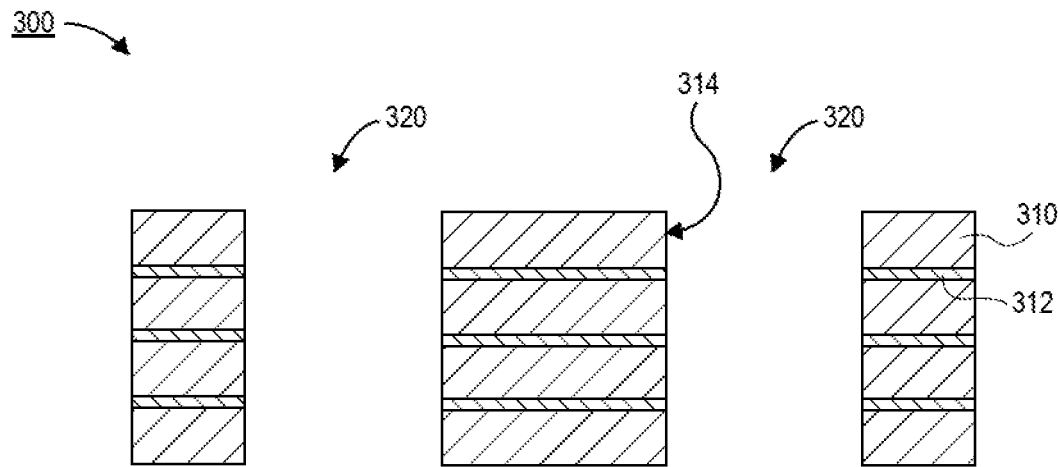
FIG. 3D is a cross-sectional illustration of the hybrid core after the dielectric layers are patterned to form through-holes through the hybrid core, in accordance with an embodiment.

Referring now to FIG. 3D, a cross-sectional illustration of the hybrid core 300 after the portions 313 of the dielectric layers 312 are removed is shown, in accordance with an embodiment. The portions 313 may be removed with any suitable process. Particularly, since the thickness of the dielectric layers 312 is small, the removal of the portions 313 is not a costly process. For example, portions 313 may be removed using a mechanical process, a wet desmear process, or a dry desmear process, depending on the thicknesses of the dielectric layers 312 and the types of residues.

After removal of the portions 313, the through-holes 320 are fully formed through a thickness of the hybrid core 300. Accordingly, a through-hole 320 with a relatively high aspect ratio is provided by stacking a plurality of glass layers 310 with relatively low aspect ratio openings. In the illustrated embodiment, the hybrid core 300 includes four glass layers 310$_{A-D}$. However, it is to be appreciated that the hybrid core 300 may include any number of stacked glass layers 310 to provide a hybrid core with any desired thickness. Furthermore, since the through-holes 320 are formed by stacking layers of low aspect ratio openings, forming thicker hybrid cores (e.g., 500 µm or larger, or 700 µm or larger) does not become substantially more expensive.

Figure 3E:
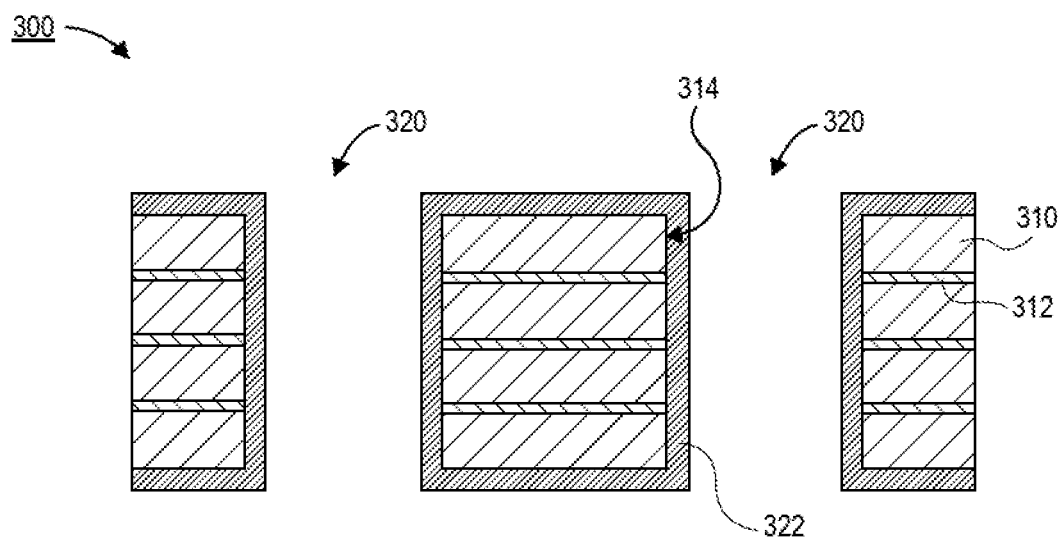
FIG. 3E is a cross-sectional illustration of the hybrid core after a conductive through-hole via is disposed in the through-holes, in accordance with an embodiment.

Referring now to FIG. 3E, a cross-sectional illustration of the hybrid core 300 after a conductive layer 322 is disposed over exposed surfaces is shown, in accordance with an embodiment. In an embodiment, the conductive layer 322 may be in direct contact with some portions of the glass layers 310. For example, the conductive layer 322 may contact sidewalls 314 of the through-holes 320 and the topmost and bottommost surfaces of the hybrid core 300.

In an embodiment, the conductive layer 322 may comprise a seed layer. For example, a seed layer may be disposed over the hybrid core 300 using a sputtering process, an electroless process or the like. After deposition of the seed layer, a plating process may be implemented to form conductive features through the thickness of the hybrid core 300. For example, portions of the conductive layer 322 lining the through-holes 320 may be referred to as through-hole vias or plated through-hole (PTH) vias. In an embodiment, the PTH vias may only line the sidewalls 314 of the through-holes 320. That is, the conductive layer 322 may not completely fill the through-holes 320 in some embodiments. However, in other embodiments, the conductive layer 322 may substantially fill the through-holes 320.

Figure 4A:
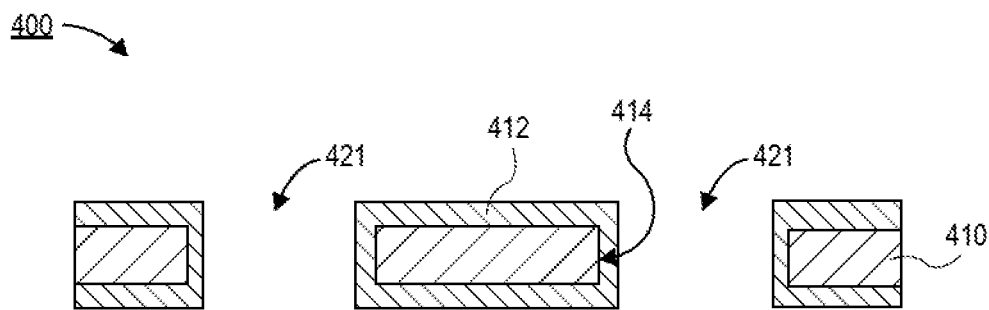
FIG. 4A is a cross-sectional illustration of a glass layer with an opening that is fully embedded in a dielectric layer, in accordance with an embodiment.
Figure 4B:
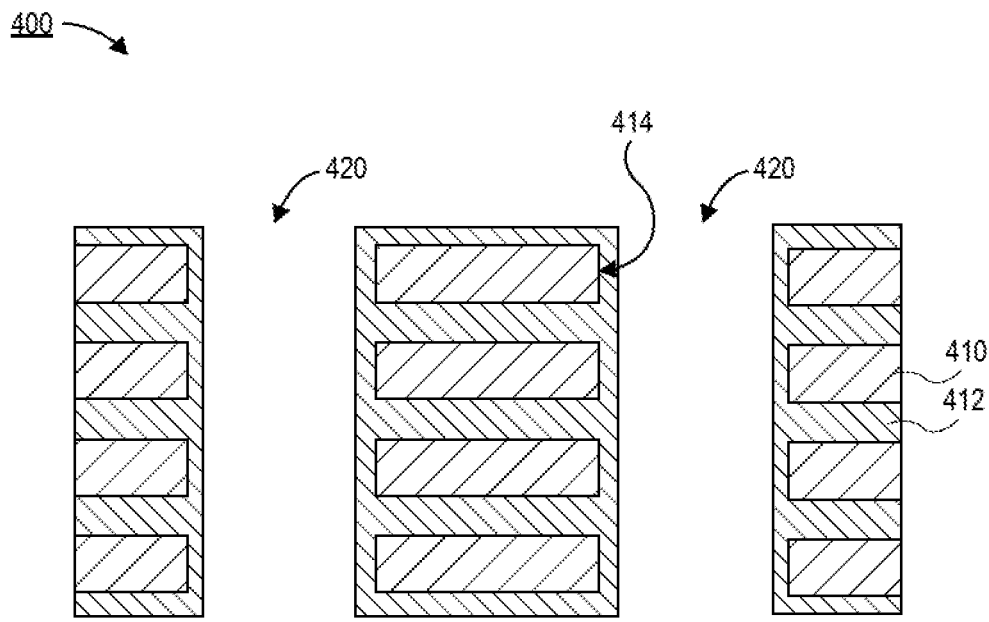
FIG. 4B is a cross-sectional illustration of a stack of glass layers that form a hybrid core, in accordance with an embodiment.
Figure 4C:
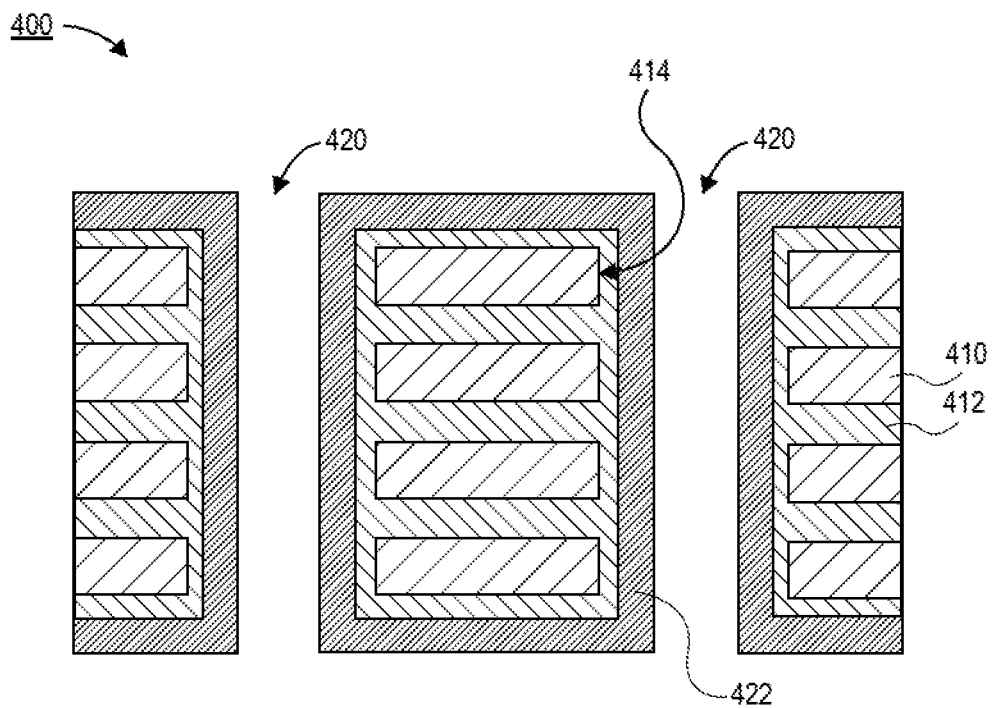
FIG. 4C is a cross-sectional illustration of the hybrid core after conductive through-hole vias are disposed in the through-holes, in accordance with an embodiment.

Referring now to FIGS. 4A-4C, a series of cross-sectional illustrations depicting a process for forming a hybrid core 400 is shown, in accordance with an additional embodiment. The hybrid core 400 illustrated in FIGS. 4A-4C may be substantially similar to the hybrid core 100 illustrated in FIG. 1B.

Referring now to FIG. 4A, a cross-sectional illustration of a hybrid core 400 is shown, in accordance with an embodiment. The glass layer 410 may be substantially similar to the glass layer 310 illustrated in FIG. 3B. For example, the glass layer 410 comprises a plurality of openings 421 that pass through a thickness of the glass layer 410. In an embodiment, the glass layer 410 may have a thickness that is approximately 100 µm or less. The glass layer 410 may be formed with substantially similar processing used to form the glass layer 310.

In an embodiment, the glass layer 410 may be embedded in a dielectric layer 412. That is, the glass layer 410 may be covered on all surfaces by the dielectric layer 412. For example, the dielectric layer 412 covers a top surface, a bottom surface, and sidewall surfaces 414 of the glass layer 410. In an embodiment, the dielectric layer 412 is a conformally deposited layer. Accordingly, the dielectric layer 412 may conform to the sidewalls 414 of the openings 421 without fully filling the openings 421. In an embodiment, the dielectric layer 412 may be applied with a wet process, such as spray coating. However, it is to be appreciated that any conformal deposition method may be used.

Referring now to FIG. 4B, a cross-sectional illustration of a hybrid core 400 is shown, in accordance with an embodiment. As shown, a plurality of glass layers 410 and dielectric layers 412 may be stacked over each other with the openings aligned in order to provide a through-hole 420. In an embodiment, the glass layers 410 may be applied over each other with a lamination process, a hot press process, or the like. Since the glass layers 410 are each embedded by a dielectric layer 412, the entire glass surface of the hybrid core 400 is covered. That is, the topmost glass surface and the bottommost glass surface are covered by the dielectric layer 412. Furthermore, the sidewall surfaces 414 of the glass layer 410 that define the through-hole 420 are covered by the dielectric layer 412.

Referring now to FIG. 4C, a cross-sectional illustration of the hybrid core 400 after a conductive layer 422 is disposed over the exposed surfaces is shown, in accordance with an embodiment. In an embodiment, the conductive layer 422 may be disposed with a sputtering process or an electroless process. In the case of electroless deposition, the aspect ratio of the through-hole 420 may be larger without having plating issues (as may be the case when a sputtering is used to deposit the seed layer). In an embodiment, the conductive layer 422 may be copper, or any other suitable conductive material.

Embodiments disclosed herein may also include plated through-holes that take advantage of magnetic materials in order to provide improved power delivery. For example, magnetic materials may line the plated through-holes. In some embodiments, the magnetic materials may be part of an inductor that is formed through the hybrid core. FIGS. 5A-5D provide cross-sectional illustrations of a process for forming such magnetic materials in a hybrid core, in accordance with various embodiments.

Figure 5A:
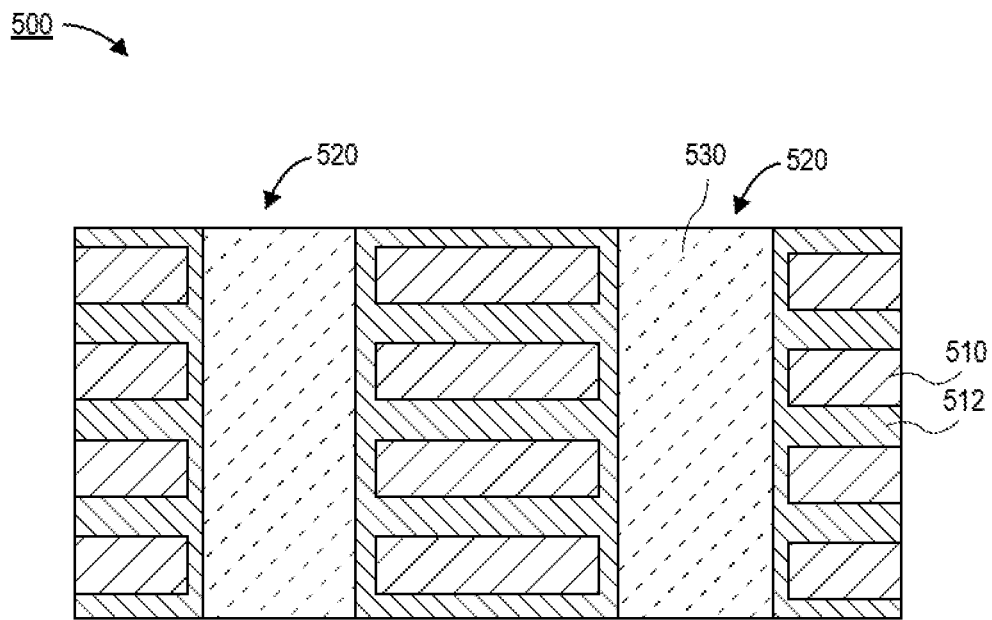
FIG. 5A is a cross-sectional illustration of a hybrid core with through-holes that are filled with magnetic plugs, in accordance with an embodiment.

Referring now to FIG. 5A, a cross-sectional illustration of a hybrid core 500 is shown, in accordance with an embodiment. In an embodiment, the hybrid core 500 may be substantially similar to the hybrid core 400 illustrated in FIG. 4B, with the exception that a magnetic plug 530 is disposed in each of the through-holes 520. That is, the hybrid core 500 may comprise a plurality of glass layers 510 and dielectric layers 512. In an embodiment, the magnetic plug 530 may only be in contact with the dielectric layer 512.

Figure 5B:
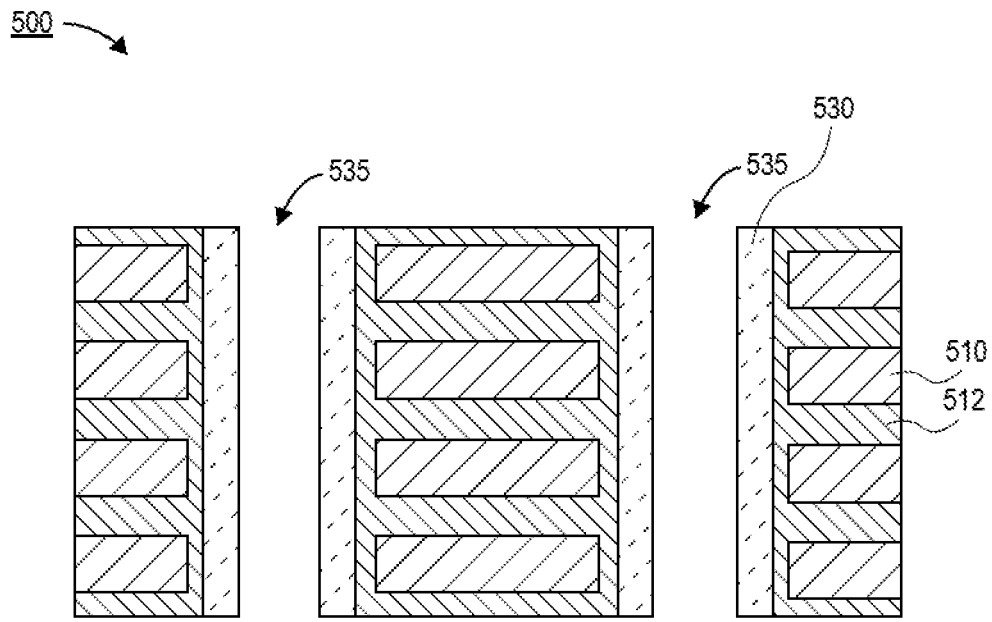
FIG. 5B is a cross-sectional illustration of the hybrid core after openings are formed through the magnetic plugs, in accordance with an embodiment.

Referring now to FIG. 5B, a cross-sectional illustration of the hybrid core 500 after plug openings 535 are formed through the magnetic plugs 530 is shown, in accordance with an embodiment. In an embodiment, the plug openings 535 may be formed with a drilling process, such as a laser drilling or mechanical drilling process. The plug openings 535 result in the magnetic plugs 530 having a ring shape with an outer surface in contact with the dielectric layer 512 and the inner surface exposed.

Figure 5C:
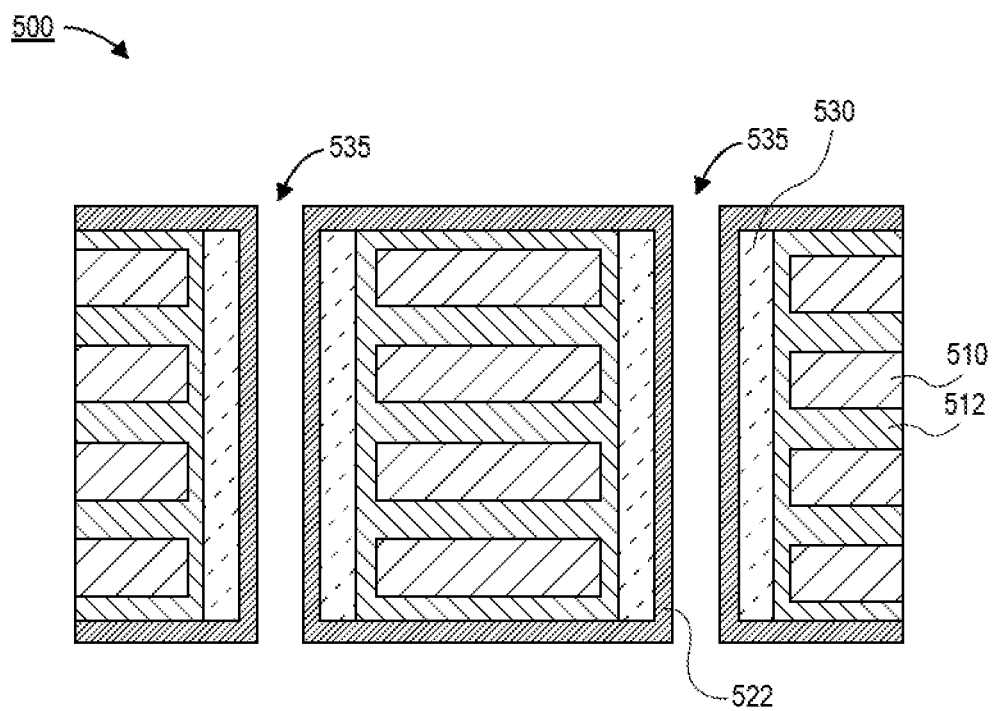
FIG. 5C is a cross-sectional illustration after conductive through-hole vias are disposed in the openings, in accordance with an embodiment.

Referring now to FIG. 5C, a cross-sectional illustration of the hybrid core 500 after a conductive layer 522 is disposed over the exposed surfaces is shown, in accordance with an embodiment. In an embodiment, the conductive layer 522 is in direct contact with the inner surface of the magnetic plug 530.

Figure 5D:
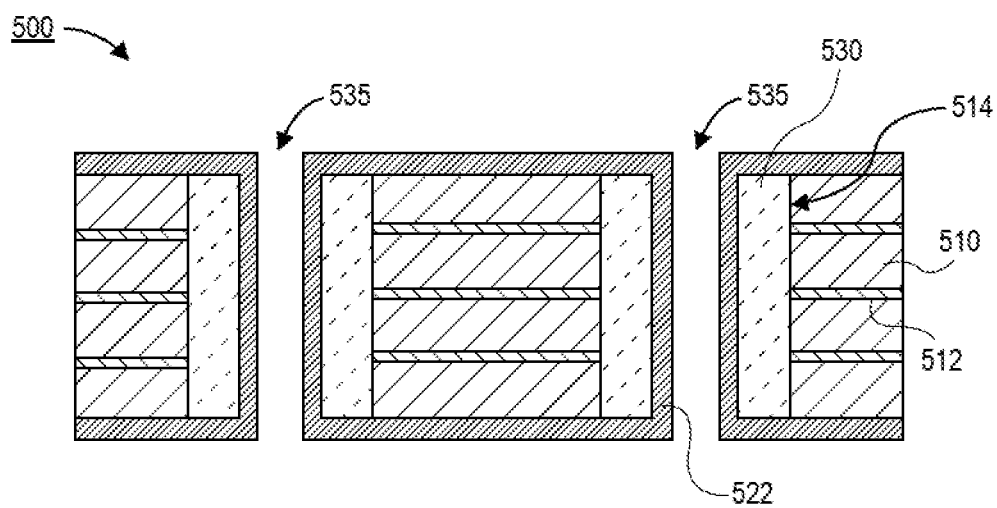
FIG. 5D is a cross-sectional illustration of a hybrid core with magnetic plugs, in accordance with an additional embodiment.

Referring now to FIG. 5D, a cross-sectional illustration of a hybrid core 500 is shown, in accordance with an additional embodiment. The hybrid core 500 may have a structure similar to the hybrid core 100 in FIG. 1A. That is, the glass layers 510 may alternate with the dielectric layers 512, and the sidewalls 514 may be exposed. In an embodiment, a magnetic plug 530 may be disposed into the opening through the hybrid core 500. The magnetic plug 530 may directly contact the sidewalls 514 of the glass layers 510. In an embodiment, a plug opening 535 may be formed through the magnetic plug 530. A conductive layer 522 may be disposed over the plug opening 535, similar to the embodiment shown in FIG. 5C.

Figure 6:
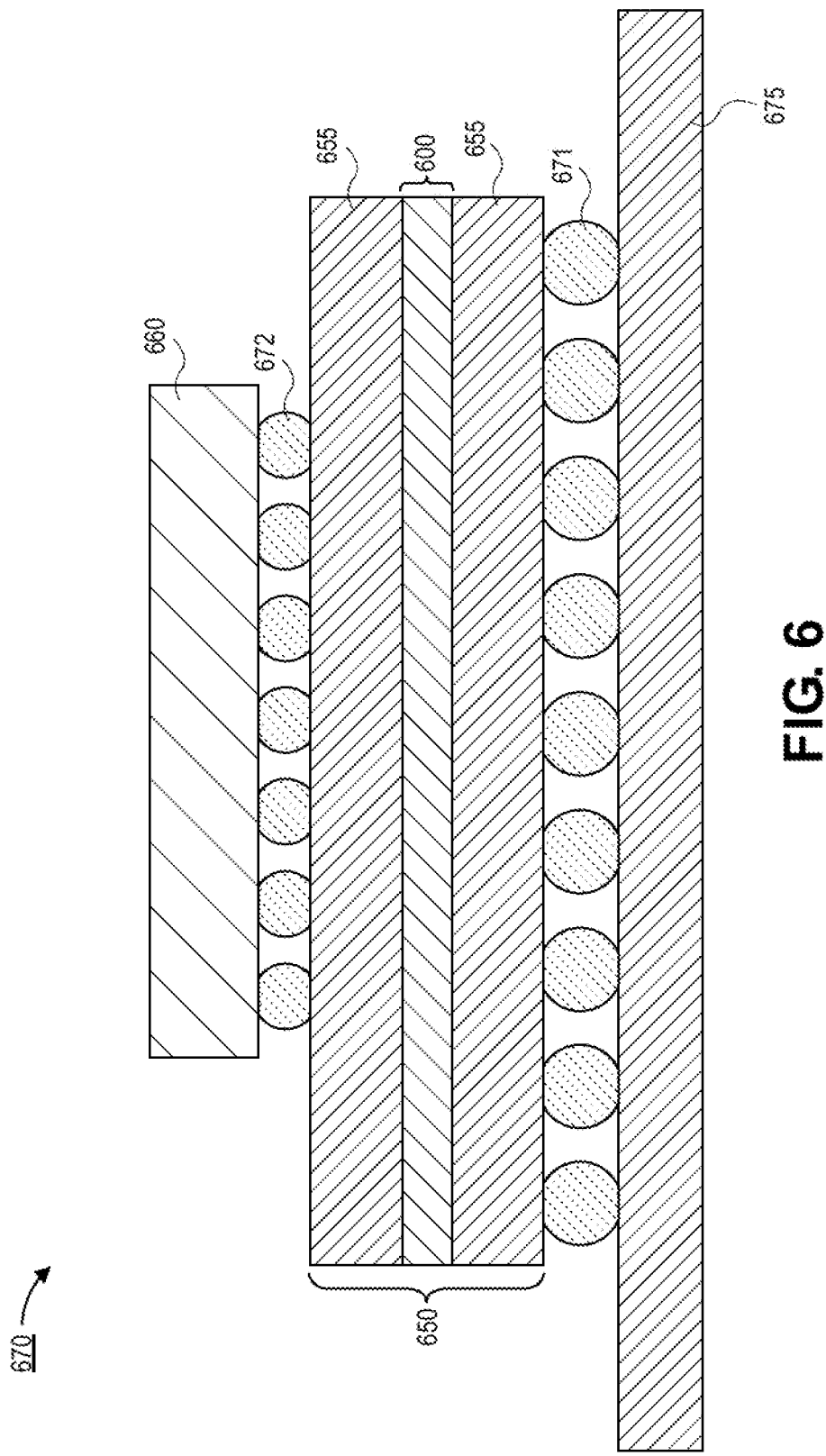
FIG. 6 is a cross-sectional illustration of an electronic package with a hybrid core, in accordance with an embodiment.

Referring now to FIG. 6, a cross-sectional illustration of an electronic system 670 is shown, in accordance with an embodiment. In an embodiment, the electronic system 670 may comprise a package substrate 650. The package substrate 650 may be a cored package substrate 650. That is, a hybrid core 600 may be between buildup layers 655. In an embodiment, the hybrid core 600 may be substantially similar to the hybrid cores described herein. For example, the hybrid core 600 may comprise alternating glass and dielectric layers. Each of the glass layers may have a thickness that is approximately 100 µm or less, and each of the dielectric layers may have a thickness that is approximately 100 nm or less. Accordingly, a thick hybrid core 600 (e.g., a total thickness of approximately 400 µm or larger) may be provided in a cost effective manner.

In an embodiment, the package substrate 650 may be electrically coupled to a board 675. For example, the board 675 may be a printed circuit board (PCB) or the like. The package substrate 650 may be connected to the board 675 by interconnects 671. In the illustrated embodiment, the interconnects 671 are shown as solder bumps. However, it is to be appreciated that any interconnect architecture may be used (e.g., wire bonds, sockets, etc.).

In an embodiment, one or more dies 660 may be electrically coupled to the package substrate 650. The die 660 may be electrically coupled to the package substrate 650 by interconnects 672. For example, the interconnects 672 may be referred to as first level interconnects (FLIs). The interconnects 672 may comprise solder, copper bumps, and/or the like.

Figure 7:
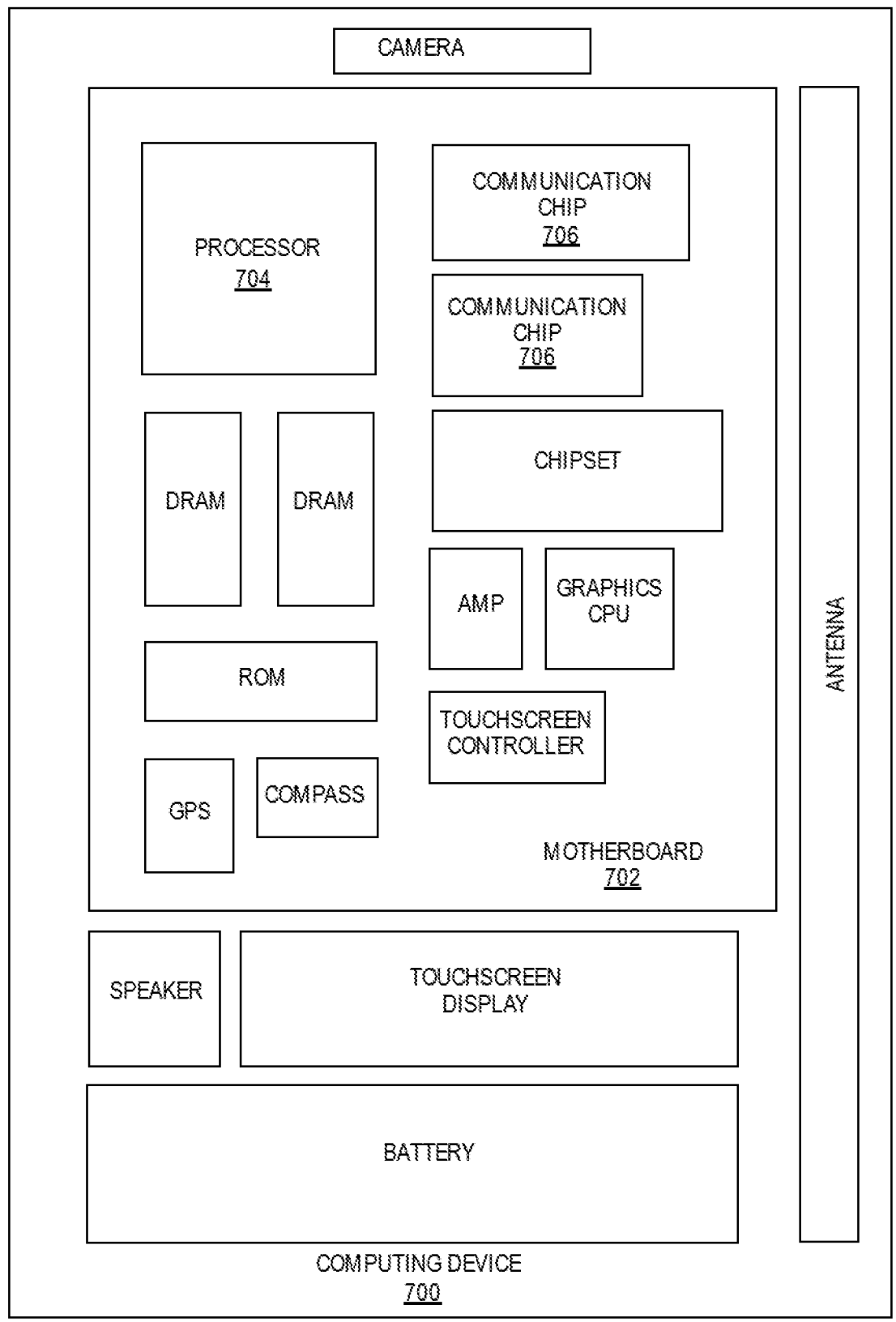
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor 704 may be part of an electronic package that comprises a hybrid core with a plurality of glass layers, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip 706 may be part of an electronic package that comprises a hybrid core with a plurality of glass layers, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a plurality of glass layers; a plurality of dielectric layers, wherein the glass layers alternate with the dielectric layers; a through-hole through the plurality of glass layers and the plurality of dielectric layers; and a conductive through-hole via in the through-hole.

Example 2: the package substrate of Example 1, wherein the conductive through-hole via is in direct contact with the glass layers.

Example 3: the package substrate of Example 1, wherein the dielectric layers fully embed the glass layers.

Example 4: the package substrate of Example 3, wherein the conductive through-hole via is separated from sidewall surfaces of the glass layers by the dielectric layers.

Example 5: the package substrate of Examples 1-4, wherein a thickness of each of the glass layers is approximately 100 µm or less.

Example 6: the package substrate of Examples 1-5, wherein a thickness of each of the dielectric layers is approximately 100 nm or less.

Example 7: the package substrate of Examples 1-6, wherein a diameter of the through-hole is approximately 100 µm or more.

Example 8: the package substrate of Examples 1-7, wherein an aspect ratio of the glass layer thickness to a through-hole diameter (thickness:diameter) is 1:1 or less.

Example 9: the package substrate of Examples 1-8, wherein the through-hole comprises a plurality of openings stacked over each other, wherein each opening is through one of the plurality of glass layers.

Example 10: the package substrate of Example 9, wherein an amount of misalignment between neighboring openings of the plurality of openings is less than 5 µm.

Example 11: the package substrate of Example 9 or Example 10, wherein each opening has a tapered profile.

Example 12: the package substrate of Example 9, wherein each opening has a vertical profile.

Example 13: the package substrate of Examples 1-12, wherein a thickness of the package substrate is approximately 500 µm or greater.

Example 14: the electronic package, comprising: a die; and a package substrate electrically coupled to the die, wherein the package substrate comprises: a core, wherein the core comprises: a plurality of glass layers alternating with a plurality of dielectric layers; and a plated through-hole via through the core.

Example 15: the electronic package of Example 14, wherein the plurality of glass layers have a thickness that is approximately 100 µm or less.

Example 16: the electronic package of Example 15, wherein an aspect ratio of the thickness of each glass layer to a diameter of the plated through-hole via (thickness:diameter) is approximately 1:1 or less.

Example 17: the electronic package of Examples 14-16, wherein a thickness of the core is approximately 500 µm or greater.

Example 18: the electronic package of Examples 14-17, wherein each of the dielectric layers have a thickness that is approximately 100 nm or less.

Example 19: the electronic package of Examples 14-18, wherein the plurality of glass layers are each embedded by the dielectric layers.

Example 20: the electronic package of Example 19, wherein the plated through-hole via only contacts the dielectric layers.

Example 21: the electronic package of Examples 14-20, wherein the plated through-hole via contacts sidewall surfaces of the plurality of glass layers.

Example 22: a hybrid core, comprising: a plurality of glass layers; a plurality of dielectric layers; an opening through the plurality of glass layers and the plurality of dielectric layers; a magnetic plug lining the opening; and a plated through-hole via lining interior surfaces of the magnetic plug.

Example 23: the hybrid core of Example 22, wherein the magnetic plug directly contacts sidewall surfaces of the glass layers.

Example 24: the hybrid core of Example 22, wherein the dielectric layers fully embed each of the plurality of glass layers, and wherein the magnetic plug is separated from sidewall surfaces of the glass layers by the dielectric layers.

Example 25: the hybrid core of Examples 22-24, wherein a thickness of each of the glass layers is approximately 100 µm or less, and wherein a diameter of the opening is approximately 100 µm or greater.

What is claimed is:

1. A package substrate, comprising:
   a plurality of glass layers, wherein one of the plurality of glass layers has a vertical sidewall that is recessed relative to a corresponding vertical sidewall of an overlying one of the plurality of glass layers and relative to a corresponding vertical sidewall of an underlying one of the plurality of glass layers;
   a plurality of dielectric layers, wherein the glass layers alternate with the dielectric layers, and wherein each of the plurality of glass layers has a thickness greater than a thickness of each one of the plurality of dielectric layers;
   a through-hole through the plurality of glass layers and the plurality of dielectric layers; and
   a conductive through-hole via in the through-hole.

2. The package substrate of claim 1, wherein the conductive through-hole via is in direct contact with the glass layers.

3. The package substrate of claim 1, wherein the dielectric layers fully embed the glass layers.

4. The package substrate of claim 3, wherein the conductive through-hole via is separated from sidewall surfaces of the glass layers by the dielectric layers.

5. The package substrate of claim 1, wherein the thickness of each of the glass layers is approximately 100 µm or less.

6. The package substrate of claim 1, wherein the thickness of each of the dielectric layers is approximately 100 nm or less.

7. The package substrate of claim 1, wherein a diameter of the through-hole is approximately 100 µm or more.

8. The package substrate of claim 1, wherein an aspect ratio of a thickness of the glass layers to a through-hole diameter (thickness:diameter) is 1:1 or less.

9. The package substrate of claim 1, wherein the through-hole comprises a plurality of openings stacked over each other, wherein each opening is through one of the plurality of glass layers.

10. The package substrate of claim 9, wherein an amount of misalignment between neighboring openings of the plurality of openings is less than 5 µm.

11. The package substrate of claim 9, wherein each opening has a vertical profile.

12. The package substrate of claim 1, wherein a thickness of the package substrate is approximately 500 µm or greater.

13. An electronic package, comprising:
    a die; and
    a package substrate electrically coupled to the die, wherein the package substrate comprises:
      a core, wherein the core comprises:
        a plurality of glass layers alternating with a plurality of dielectric layers, wherein each of the plurality of glass layers has a thickness greater than a thickness of each one of the plurality of dielectric layers, and wherein one of the plurality of glass layers has a vertical sidewall that is recessed relative to a corresponding vertical sidewall of an overlying one of the plurality of glass layers and relative to a corresponding vertical sidewall of an underlying one of the plurality of glass layers; and
      a plated through-hole via through the core.

14. The electronic package of claim 13, wherein the plurality of glass layers have the thickness that is approximately 100 µm or less.

15. The electronic package of claim 14, wherein an aspect ratio of the thickness of each glass layer to a diameter of the plated through-hole via (thickness:diameter) is approximately 1:1 or less.

16. The electronic package of claim 13, wherein a thickness of the core is approximately 500 µm or greater.

17. The electronic package of claim 13, wherein each of the dielectric layers have the thickness that is approximately 100 nm or less.

18. The electronic package of claim 13, wherein the plurality of glass layers are each embedded by the dielectric layers.

19. The electronic package of claim 18, wherein the plated through-hole via only contacts the dielectric layers.

20. The electronic package of claim 13, wherein the plated through-hole via contacts sidewall surfaces of the plurality of glass layers.

21. A hybrid core, comprising:
- a plurality of glass layers, wherein one of the plurality of glass layers has a vertical sidewall that is recessed relative to a corresponding vertical sidewall of an overlying one of the plurality of glass layers and relative to a corresponding vertical sidewall of an underlying one of the plurality of glass layers;
- a plurality of dielectric layers, wherein each of the plurality of glass layers has a thickness greater than a thickness of each one of the plurality of dielectric layers;
- an opening through the plurality of glass layers and the plurality of dielectric layers;
- a magnetic plug lining the opening; and
- a plated through-hole via lining interior surfaces of the magnetic plug.

22. The hybrid core of claim 21, wherein the magnetic plug directly contacts sidewall surfaces of the glass layers.

23. The hybrid core of claim 21, wherein the dielectric layers fully embed each of the plurality of glass layers, and wherein the magnetic plug is separated from sidewall surfaces of the glass layers by the dielectric layers.

24. The hybrid core of claim 21, wherein a thickness of each of the glass layers is approximately 100 μm or less, and wherein a diameter of the opening is approximately 100 μm or greater.

* * * * *